United States Patent
Yokoi et al.

(10) Patent No.: US 7,442,675 B2
(45) Date of Patent: Oct. 28, 2008

(54) CLEANING COMPOSITION AND METHOD OF CLEANING SEMICONDUCTOR SUBSTRATE

(75) Inventors: Shigeru Yokoi, Kanagawa (JP); Kazumasa Wakiya, Kanagawa (JP); Takayuki Haraguchi, Kanagawa (JP); Makarem A. Hussein, Beaverton, OR (US); Lana I. Jong, Hillsboro, OR (US); Shan Christopher Clark, Forest Grove, OR (US)

(73) Assignees: Tokyo Ohka Kogyo Co., Ltd., Kanagawa (JP); Intel Corporation, Santa Clara, CA (US)

( * ) Notice: Subject to any disclaimer, the term of this patent is extended or adjusted under 35 U.S.C. 154(b) by 372 days.

(21) Appl. No.: 10/864,394

(22) Filed: Jun. 10, 2004

(65) Prior Publication Data

US 2004/0259761 A1 Dec. 23, 2004

Related U.S. Application Data

(60) Provisional application No. 60/479,146, filed on Jun. 18, 2003.

(51) Int. Cl.
*C11D 7/06* (2006.01)
*C11D 7/50* (2006.01)
*C23G 1/16* (2006.01)
*C23G 5/032* (2006.01)

(52) U.S. Cl. .................. 510/175; 510/259; 510/272; 510/435; 510/504; 134/2

(58) Field of Classification Search ............ 510/175, 510/435, 259, 272, 504; 134/2
See application file for complete search history.

(56) References Cited

U.S. PATENT DOCUMENTS

| | | | |
|---|---|---|---|
| 3,980,587 A | | 9/1976 | Sullivan |
| 4,776,892 A | * | 10/1988 | Steppan et al. ............... 134/38 |
| 4,964,919 A | * | 10/1990 | Payne ........................... 134/2 |
| 5,139,607 A | * | 8/1992 | Ward et al. .................... 216/83 |
| 5,962,197 A | * | 10/1999 | Chen ........................... 430/331 |
| 5,962,383 A | * | 10/1999 | Doyel et al. ................. 510/164 |
| 6,200,947 B1 | | 3/2001 | Takashima et al. |
| 6,228,179 B1 | * | 5/2001 | Morinaga ..................... 134/2 |
| 6,472,357 B2 | * | 10/2002 | Takashima .................. 510/175 |
| 6,508,887 B1 | | 1/2003 | Park et al. |
| 2001/0039251 A1 | * | 11/2001 | Sachdev et al. ............. 510/177 |
| 2002/0022582 A1 | * | 2/2002 | Takashima .................. 510/175 |
| 2003/0004085 A1 | * | 1/2003 | Ando et al. ................. 510/438 |
| 2004/0106532 A1 | * | 6/2004 | Yokoi et al. ................. 510/178 |

FOREIGN PATENT DOCUMENTS

| | | |
|---|---|---|
| EP | 0662705 A2 | 7/1995 |
| EP | 0875926 A | 11/1998 |
| JP | 4-240738 A | 8/1992 |
| JP | 2001-152190 A | 6/2001 |
| JP | 2001-244228 A | 9/2001 |
| JP | 2002-357908 A | 12/2002 |
| WO | WO03/006598 A1 | 1/2003 |

* cited by examiner

*Primary Examiner*—Lorna M Douyon
(74) *Attorney, Agent, or Firm*—Hoffmann & Baron, LLP

(57) ABSTRACT

A cleaning composition comprises at least quaternary ammonium hydroxide, a water-soluble organic solvent, water, an anticorrosive, and potassium hydroxide of 1 mass percent or less of a total amount of the solution. This cleaning composition can singly and effectively remove a photoresist film, a buried material, a metallic residue from the surface of a semiconductor substrate.

6 Claims, No Drawings

CLEANING COMPOSITION AND METHOD OF CLEANING SEMICONDUCTOR SUBSTRATE

This application claims benefit of Provisional Application No. 60/479,146 filed Jun. 18, 2003; the disclosure of which is incorporated herein by reference.

BACKGROUND OF THE INVENTION

1) Field of the Invention

The present invention relates to a cleaning composition that effectively cleans a photoresist film, a buried material, and a metallic residue, from a surface of a substrate. The present invention also relates to a method of cleaning a semiconductor substrate using the cleaning composition and a method of forming wiring on a semiconductor substrate using the cleaning composition.

2) Description of the Related Art

Semiconductor substrates are generally formed by depositing a dielectric layer (insulation layer) on substrates made of, for example, silicon. A patterned conductive layer (i.e., a wiring layer) is formed in the dielectric layer of the semiconductor substrate to form a wiring.

The layers or the films that are used to form the patterns, for example, the photoresist film, are removed after the films have performed their roles. These layers or the films are removed so as not to become an obstacle in the subsequent process. The layers or the films are removed using a stripping solution. The stripping solution is also used to remove residues of metal or the like in the process of wiring formation. Conventionally, compositions of the stripping solutions have been optimized for use according to a target film to be stripped and a target residue to be cleaned.

However, it has been quite complicated to prepare a variety of stripping solutions for each purpose. Furthermore, storage facilities and supply routes for preservation and use of the solutions have been required in respective cases, and therefore the dedicated facilities and devices have needed to be provided. As a result, the fabrication process of the semiconductor becomes costlier. Therefore, a stripping solution having high strippability and cleaning power and that is all-purpose has been required.

The inventors of the present invention worked toward the development of such a stripping solution. Consequently, the inventors found that a stripping solution containing a quaternary ammonium compound as a main component may be a required one.

However, with regard to the properties required for the stripping solution from the viewpoint of the semiconductor substrate, the conventional method has following problems.

Generally, in the semiconductor fabrication process, a photoresist film is removed through $O_2$ plasma ashing or with an amine-based stripping solution, while in the method of forming multilayer interconnection using the damascene process, the buried material (which is also referred to as a sacrificed film) is removed with a hydrofluoric acid dilution after the photoresist film is removed.

The dielectric layer shields the wiring layer provided under the photoresist film and the buried material, and electrically insulates the wiring layer from another wiring layer. This dielectric layer is required to have a permittivity as low as possible in order to prevent influence thereof from being exerted on the electrical characteristics of the wiring layer. Among dielectric layers having a low permittivity, a particular dielectric layer having a permittivity k of 3.2 or less is becoming a mainstream.

However, a material (low-k material) having such a low permittivity is low resistant against $O_2$ plasma ashing and the hydrofluoric acid dilution, and therefore the surface of the material easily deteriorates or the permittivity rises. Consequently, the electrical characteristic of the wiring layer is badly affected.

The inventors evaluated the stripping solution containing the quaternary ammonium compound as a main component. The inventors found that a lot of time is required to completely remove the photoresist film and the buried material when the stripping solution was used. The inventors concluded that the low-k material and copper (Cu) deteriorates because the treatment is performed for a long time.

The inventors prepared raw materials that could become components of the stripping solution and also some types of the same material, and prepared samples of the stripping solution by combinations of the types to evaluate stripping characteristics of the samples. The inventors found that some of the samples were excellent in the stripping characteristics and there was no bad effect on the surface of the low-k material. The inventors then analyzed these samples and found that these samples contained traces of potassium hydroxide (KOH). Therefore, the inventors concluded that if traces of KOH are added to the solution, it is possible to clean the substrates quickly without damaging the low-k material and Cu, and even the strippability is high.

The inventors studied the existing literatures to find out the reason why the existence of KOH in the stripping solution gave better results, what could be the best amount of the KOH, and what is the best method to adding the KOH. The inventors studied, for example, Japanese Patent Application Laid Open (JP-A) No. 2001-152190, U.S. Pat. Nos. 3,980,587, and 5,139,607. Consequently, the inventors realized that a stripping solution with the KOH has already been proposed. For example, the inventors realized that a cleaning solution for semiconductors containing KOH has been proposed in JP-A No. 2001-244228 and that a cleaning agent for integrated circuits containing KOH has been proposed in Japanese Patent (JP) No. 2836263.

However, in the stripping solution disclosed in JP-A No. 2001-152190, the KOH is exemplified only as one of candidate components selected from a fluoride-based reducing agent and a hydroxide-based reducing agent. Moreover, the problem described in JP-A No. 2001-152190 was solved by the composition that did not contain the KOH. In other words, the idea that a combination of at least the quaternary ammonium hydroxide, solution, water, anticorrosive, and KOH allows stripping characteristics to be improved without degradation of the surface of the low-k material, has been neither disclosed nor suggested. In addition, information required for actual use such as compositions for an optimal combination containing KOH as an essential component and each amount of the compositions, is not even suggested. Furthermore, strippability of the buried material is not clear from the publication.

In the compositions disclosed in the U.S. Pat. Nos. 3,980,587 and 5,139,607, as explained later, the amount of KOH is more that the upper limit of the same in the present invention. With that amount of KOH, however, it is quite impossible to remove the photoresist film or the like without degradation of the low-k material. Thus, the U.S. Pat. Nos. 3,980,587 and 5,139,607 do not solve the problem to be solved in the present invention.

Furthermore, with the technology disclosed in the JP-A No. 2001-244228 and JP No. 2836263, it is impossible to effectively remove the photoresist film or the like because components of a composition are different from those in the present invention. Moreover, the JP-A No. 2001-244228 and JP No. 2836263 do not solve the problem to be solved in the present invention.

SUMMARY OF THE INVENTION

It is an object of the present invention to provide a cleaning composition that contains at least quaternary ammonium hydroxide and KOH as an essential combination and can singly and effectively remove the photoresist film, the buried material, and the residue of metal from the surface of the semiconductor substrate without degrading the low-k material.

The inventors of the present invention realized, based on experiments, that the cleaning composition can singly strip and remove photoresist films, buried materials, and metallic residues without corrosion to a substrate-forming layer such as a low-k material, if it contain at least quaternary ammonium hydroxide, a water-soluble organic solvent, water, an anticorrosive, and potassium hydroxide (KOH) of 1 mass percent or less of a total amount of the solution.

As a result, a cleaning composition (A) according to one aspect of the present invention consists of at least quaternary ammonium hydroxide, a water-soluble organic solvent, water, an anticorrosive, and potassium hydroxide of 1 mass percent or less of a total amount of the solution.

A semiconductor substrate cleaning method (B) according to another aspect of the present invention includes applying the cleaning composition to a semiconductor substrate that is in the process of forming metal wiring using a temporary laminated film obtained by temporarily layering film on the substrate. The method also includes removing at least one of a photoresist film and a buried material as the laminated film temporarily formed on the substrate, and a metallic residue after formation of the etched space. The cleaning composition contains at least quaternary ammonium hydroxide, a water-soluble organic solvent, water, an anticorrosive, and potassium hydroxide of 1 mass percent or less of a total amount of the solution.

The semiconductor substrate may include at least a low-dielectric layer of which permittivity k is 3.2 or less.

A method of forming wiring according to still another aspect of the present invention includes forming an etched space in a dielectric layer on a substrate using a laminated film temporarily provided by a lithography method, forming a metal wiring layer by burying metal in the etched space, and removing at least one of a photoresist film and a buried material as the laminated film temporarily formed on the substrate, and a metallic residue after formation of the metal wiring layer, using a cleaning composition. The removal is performed at a predetermined point in time in the process of forming the metal wiring layer. Furthermore, the cleaning composition contains at least quaternary ammonium hydroxide, a water-soluble organic solvent, water, an anticorrosive, and potassium hydroxide of 1 mass percent or less of a total amount of the solution.

The predetermined point in time may be a time after the etched space is formed.

And the etched space is formed with a first etched space formed in the first dielectric layer and a second etched space formed in the second dielectric layer so that the second etched space communicates with the first etched space. The first etched space may be temporarily filled with a material to be buried before the second etched space is formed.

The buried material may be removed from the first etched space using the cleaning composition after the second etched space is formed.

The first etched space may be a trench and the second etched space may be a via hole.

The first etched space may be a via hole and the second etched space may be a trench.

The dielectric layer may be a low-dielectric layer of which permittivity k is 3.2 or less.

DETAILED DESCRIPTION

The cleaning composition (A) of the present invention contains at least (a-1) quaternary ammonium hydroxide, (a-2) water-soluble organic solvent, (a-3) water, (a-4) potassium hydroxide of 1 mass percent or less of the total amounts of the solution, and (a-5) anticorrosive. The present invention will be explained in detail below, and materials to be used can be any of commercially available materials unless otherwise specified.

(A) Cleaning Composition (a-1) Quaternary Ammonium Hydroxide

The quaternary ammonium hydroxide is compounded to improve the strippability of a photoresist film used for wiring patterning, particularly an etched resist formed when a substrate is etched.

As the quaternary ammonium hydroxide, a compound represented by the following general formula (1) is preferable.

$$[NR_1R_2R_3R_4]^+OH^- \tag{1}$$

Where $R_1$, $R_2$, $R_3$, and $R_4$ are each either an alkyl group or a hydroxyalkyl group having 1 to 4 carbon atoms.

Specifically, the quaternary ammonium hydroxide is particularly preferably at least one compound selected from among tetramethylammonium hydroxide, tetraethylammonium hydroxide, tetrapropylammonium hydroxide, tetrabutylammonium hydroxide, methyltripropylammonium hydroxide, and methyltributylammonium hydroxide in terms of the availability. Furthermore, tetramethylammonium hydroxide and/or tetraethylammonium hydroxide is preferable from the viewpoint of enhancing solubility of temporarily formed laminated film, particularly a buried material of the laminated film.

The quaternary ammonium hydroxide is compounded preferably in an amount of 1 to 20 mass percent, more preferably 2 to 15 mass percent of the total amounts of the cleaning composition. If the proportion is beyond this range, for example, if the proportion is less than the lower limit, i.e., 1 mass percent, the overall stripping ability tends to be insufficient. Conversely, if the proportion is more than the upper limit, i.e., 20 mass percent, the substrate forming layer (low-k material) is prone to corrode.

(a-2) Water-soluble Organic Solvent

As the water-soluble organic solvent, any ordinarily used compound can be used. The water-soluble organic solvent is largely divided into an alkanolamine-based water-soluble organic solvent and any water-soluble organic solvent other than that, and an appropriate one can be selectively use.

As the alkanolamine-based water-soluble organic solvent, any ordinarily used compound can be used. More specifically, the compound includes monoethanolamine (MEA), diethanolamine, triethanolamine, 2-(2-aminoethoxy) ethanol, N,N-dimetylethanolamine, N,N-dietylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine, and the like.

Among these, monoethanolamine, 2-(2-aminoethoxy) ethanol, and N-methylethanolamine are preferably selected. Any alkanolamine-based water-soluble organic solvent may be used either singly or in admixture.

The water-soluble organic solvents other than the alkanolamine-based water-soluble organic solvent include sulfoxides, such as dimethyl sulfoxide; sulfones, such as dimethyl sulfone, diethyl sulfone, bis (2-hydroxyethyl) sulfone, and tetramethylene sulfone; amides, such as N,N-dimetylformamide, N-metylformamide, N,N-dimetylacetamide, N-metylacetamide, and N,N-dietylacetamide; lactams, such as N-methyl-2-pyrrolidone, N-ethyl-2-pyrrolidone, N-hydroxymethyl-2-pyrrolidone, and N-hydroxyethyl-2-pyrrolidone; lactones, such as β-propiolactone, γ-butyrolactone, γ-valerolactone, δ-valerolactone, γ-caprolactone, and ε-caprolactone; imidazolidinones, such as 1,3-dimethyl-2-imidazolidinone, 1,3-diethyl-2-imidazolidinone, and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobutyl ether, ethylene glycol monoacetate, ethylene glycol monomethyl ether acetate, ethylene glycol monoethyl ether acetate, diethylene glycol, diethylene glycol monoacetate, diethylene glycol monomethyl ether, diethylene glycol monoethyl ether, diethylene glycol monobutyl ether, propylene glycol, propylene glycol monomethyl ether, dipropylene glycol monomethyl ether, glycerol, 1,2-butylene glycol, 1,3-butylene glycol, and 2,3-butylene glycol. Component may be used either alone or in combination with one another.

Specifically, a most preferable solvent is at least one selected from among dimethyl sulfoxide, dimethyl imidazolidinone, N-methyl-2-pyrrolidone, and diethylene glycol monobutyl ether.

Such water-soluble organic solvents are preferably compounded in an amount of 1 to 82 mass percent, more preferably 2 to 78 mass percent of the total amounts of the cleaning composition. If the proportion is beyond this range, for example, if the proportion is less than the lower limit, the overall stripping ability tends to be insufficient. Conversely, if the proportion is more than the upper limit, the substrate forming layer is prone to corrode.

The water-soluble organic solvent may be the alkanolamine-based water-soluble organic solvent and any water-soluble organic solvent other than that. However, it is preferable to use the water-soluble organic solvent other than the alkanolamine-based one if it is used singly. In this case, corrosion to the low-k material can be further suppressed as compared with the case where the alkanolamine-based water-soluble organic solvent is used singly.

The alkanolamine-based water-soluble organic solvent and any other water-soluble organic solvent may be used as a compounded solvent. By using the compounded solvent, it is further possible to improve the stripping ability of the photoresist film and metallic residues.

When the compounded solvent is used, the alkanolamine-based water-soluble organic solvent is compounded preferably in an amount of 1 to 50 mass percent, more preferably 2 to 40 mass percent, of the total amounts of the cleaning composition. Furthermore, an amount of water-soluble organic solvent other than the alkanolamine-based water-soluble organic solvent is determined as the remainder of the total compounded amount of the water-soluble organic solvent.

(a-3) Water

Water is compounded preferably in an amount of 10 to 80 mass percent, more preferably by 15 to 75 mass percent, of the total amounts of the cleaning composition. If the proportion is beyond this range, for example, if the proportion is less than the lower limit (10 mass percent), removal performance on the residues tends to be degraded. Conversely, if the proportion is more than the upper limit (80 mass percent), the various types of metal such as Cu remaining on the substrate are prone to corrode.

(a-4) Potassium Hydroxide (KOH)

An amount of KOH to be compounded is preferably 1 mass percent or less, more preferably 0.001 to 0.3 mass percent, of the total amounts of the cleaning composition. The KOH is particularly preferred to be compounded in an amount of 0.01 to 0.1 mass percent. By adding a trace amount of KOH, it is possible to increase an etching rate of a buried material used in the damascene process, which makes it possible to increase an etching selectivity between the buried material and the low-k material as a substrate forming material. That is, the addition of the KOH allows the buried material to be speedily removed without damaging the low-k material. On the other hand, if the KOH is added excessively than the upper limit, the substrate forming layer is prone to corrode.

The KOH also has an effect to enhance the solubility of the buried material used in the damascene process.

(a-5) Anticorrosive

As an anticorrosive, at least one selected from among benzotriazole-based compounds and mercapto group containing compounds is used. The benzotriazole-based compounds include the ones represented by the following general formula (2).

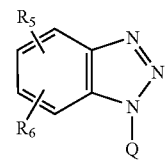

(2)

Where $R_5$ and $R_6$ are each independently a hydrogen atom, a substituted or unsubstituted hydrocarbon group of 1 to 10 carbon atoms, a carboxyl group, an amino group, a hydroxyl group, a cyano group, a formyl group, a sulfonylalkyl group, or a sulfo group; Q is a hydrogen atom, a hydroxyl group, a substituted or unsubstituted hydrocarbon group of 1 to 10 carbon atoms (the hydrocarbon group may have an amide bond or ester bond in the structure), an aryl group, or the group represented by the following general formula (3).

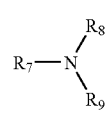

(3)

Where $R_7$ represents an alkyl group of 1 to 6 carbon atoms; and $R_8$ and $R_9$ each independently represent a hydrogen atom, a hydroxyl group, or a hydroxyalkyl group or an alkoxyalkyl group of 1 to 6 carbon atoms.

In the definition of the groups Q, $R_5$, and $R_6$ in the general formula (2) as specified in the present invention, each of the hydrocarbon groups may be an aromatic hydrocarbon group or an aliphatic hydrocarbon group, may be saturated or unsaturated, and may be a straight chain or a branched chain. Examples of a substituted hydrocarbon group include hydroxyalkyl groups and alkoxyalkyl groups.

In the general formula (2), Q is particularly preferable to be a group represented by the formula (3). In the formula (3), as $R_8$ and $R_9$, it is preferable to independently select a hydroxyalkyl group or an alkoxyalkyl group of 1 to 6 carbon atoms.

In the general formula (2), Q preferably forms a water-soluble group. More specifically, a hydrogen atom, an alkyl group of 1 to 3 carbon atoms (i.e., methyl group, ethyl group, propyl group, or isopropyl group), a hydroxyalkyl group of 1 to 3 carbon atoms, and a hydroxyl group are particularly preferred.

Specific examples of the benzotriazole-based compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, 1-benzotriazole-methyl carboxylate, 5-benzotriazole-carboxylic acid, 1-methoxybenzotriazole, 1-(2,2-dihydroxyethyl)benzotriazole, 1-(2,3-dihydroxypropyl) benzotriazole, and products of "IRGAMET" series marketed from Ciba Speciality Chemicals such as 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, and 2,2'-{[(4-methyl-1H-benzotriazol-1-yl)methyl]imino}bispropane. Among these compounds, it is particularly preferable to use 1-(2,3-dihydroxypropyl)benzotriazole, 2,2'-{[(4-methyl-1H-benzotriazol-1-yl)methyl]imino}bisethanol, and 2,2'-{[(5-methyl-1H-benzotriazol-1-yl)methyl]imino}bisethanol, etc. The benzotriazole compounds may be used either individually or in combination.

The mercapto group containing compound has preferably such a structure that a hydroxyl group and/ or a carboxyl group is present in either α-position or β-position on the carbon atom binding to the mercapto group. Specifically, preferred examples of such a compound include 1-thioglycerol, 3-(2-aminophenylthio)-2-hydroxypropylmercaptan, 3-(2-hydroxyethylthio)-2-hydroxypropylmercaptan, 2-mercaptopropinic acid, and 3-mercaptopropinic acid. Among these, 1-thioglycerol is used with particular preference.

Such anticorrosives are compounded preferably in an amount of 0.1 to 10 mass percent, more preferably 0.2 to 8 mass percent, of the total amounts of the cleaning composition. If the proportion is beyond this range, for example, if the proportion is less than the lower limit, Al and Cu are prone to corrode. Conversely, even if the anticorrosive is added more than the upper limit, any particular effect corresponding to the added amount is not recognized.

Furthermore, a surface-active agent as a given additive component can be added as required. As such a surface-active agent, an acetylene alcohol-based surface-active agent usually used for the cleaning composition is preferably used.

An amount of the agent to be added is preferably in a range of less than 0.5 mass percent.

The most preferable composition of the cleaning composition consists of 2 to 15 mass percent of quaternary ammonium hydroxide, 2 to 85 mass percent of water-soluble organic solvent, 15 to 70 mass percent of water, 0.01 to 0.1 mass percent of KOH, and 0.2 to 8 mass percent of anticorrosive, of the total amounts of the cleaning composition. More specifically, there is one composition consisting of 5 mass percent of tetraethylammonium hydroxide as quaternary ammonium hydroxide, N-methyl-2-pyrrolidone as the remainder of the total amount of the water-soluble organic solvent, 30 mass percent of 2-(2-aminoethoxy) ethanol, 30 mass percent of water, 0.02 mass percent of KOH, 1.5 mass percent of 1-thioglycerol as an anticorrosive, and 1.0 mass percent of IRGAMET 42 (Ciba Speciality Chemicals) also as an anticorrosive. Alternatively, there is another composition consisting of 10 mass percent of tetramethylammonium hydroxide as quaternary ammonium hydroxide, N-methyl-2-pyrrolidone as the remainder of the total amount of the water-soluble organic solvent, 40 mass percent of water, 0.02 mass percent of KOH, 1.5 mass percent of 1-thioglycerol as an anticorrosive, and 1.0 mass percent of IRGAMET 42 (Ciba Speciality Chemicals) also as an anticorrosive.

The cleaning composition for lithography of the present invention is useful for removing a photoresist film and metallic residues when a via pattern is formed or a trench pattern is formed using a buried material particularly in the process of forming wiring using the damascene process.

(B) Method of Cleaning Semiconductor Substrate

The method of cleaning semiconductor substrates according to the present invention is a method of applying the cleaning composition to the semiconductor substrate in the process of forming metal wiring using temporary laminated film that is temporarily layered on the substrate, and removing at least one of a photoresist film, a buried material as the laminated film temporarily formed on the substrate, and metallic residues after formation of the metal wiring. The cleaning composition contains at least quaternary ammonium hydroxide, a water-soluble organic solvent, water, an anticorrosive, and potassium hydroxide of 1 mass percent or less of the total amounts of the solution.

If the substrate includes at least a low-dielectric layer having a permittivity k of less than 3.2 or preferably less than 3.0, the cleaning method of this invention has an advantage particularly in enabling cleaning of the photoresist film and metallic residues without damaging the substrate.

A specific material used for the low-dielectric layer having a permittivity k of less than 3.2 includes carbon doped oxide (SiOC)-based, methylsilsesquioxane (MSQ)-based, and hydroxysilsesquioxane (HSQ)-based materials. Specifically, the carbon doped oxide-based low dielectric material includes Black Diamond (product name) by Applied Materials, Inc., Coral (product name) by Novellus Systems, Inc., and Aurora (product name) by ASM Japan K.K.

The methylsilsesquioxane-based low dielectric material includes materials commercially available with the product names of "OCL T-31", "OCL T-37", and "OCL T-39" by Tokyo Ohka Kogyo Co., Ltd. Furthermore, the hydroxysilsesquioxane-based low dielectric material includes materials commercially available with the product names of "OCD T-12" and "OCL T-32" by Tokyo Ohka Kogyo Co., Ltd.

When the buried material is to be stripped away, by using the method of cleaning the semiconductor substrate according to the present invention, it is possible to clean the buried material off without damaging the low-k material because a hydrofluoric acid dilution is not used in this invention.

A photoresist film used in the present invention is not limited to any particular one if the photoresist film is generally used in semiconductor fabrication. "Photoresist film" in the specification of this invention includes a photoresist film used for patterning and also etched resist that is formed when the substrate is etched.

Metal used in the present invention is not limited to any particular one if the metal is used for a conductive layer. More specifically, the metal includes Cu, a Cu alloy, Al, and an Al alloy. The amount of (a-3) water and (a-5) anticorrosive to be compounded is prepared in an appropriate range as specified in the present invention, and therefore the metal remaining on the substrate as the conductive layer is not corroded.

The method of cleaning the substances is not limited to any particular one if the method is generally performed. More specifically, there is provided a method of cleaning them off for 1 to 40 minutes using a dip method, a paddle method, and a showering method. In order to increase the cleaning effect, heating may be provided. If so, heating is performed preferably for 3 to 30 minutes at 20 to 85° C., more preferably at 40 to 80° C.

(C) Method of Forming Wiring

The method of forming wiring according to the present invention includes removing at least one of a photoresist film, a buried material as laminated film temporarily formed on a substrate, and metallic residues after formation of a metal wiring layer by using a cleaning composition. Specifically, the removal is performed at a predetermined point in time during a process for forming the metal wiring layer by burying the metal in an etched space formed in a dielectric layer on the substrate using the laminated film based on a lithography technology. The cleaning composition contains at least quaternary ammonium hydroxide, a water-soluble organic solvent, water, an anticorrosive, and potassium hydroxide of 1 mass percent or less of the total amounts of the solution.

A specific example of the method of forming the metal wiring layer is the damascene process. If the damascene process is employed, a low-dielectric layer is deposited on the substrate where the conductive layer is formed via a barrier layer, and via holes and/or trenches are formed in the deposited layer using the ordinary lithography method. Particularly, when the via hole and the trench are simultaneously formed, the damascene process is called dual damascene process.

"The etched space formed in the dielectric layer on the substrate" specified in the present invention is considered as various types of spaces depending on the method of forming wiring and a time in which the etched space is formed. However, the etched space according to the damascene process or the dual damascene process generally indicates the via hole and/or the trench. The metal to be buried in the etched space includes metal such as Cu.

The conductive layer is formed with metal such as Cu, a Cu alloy, Al, and an Al alloy. The conductive layer with any one of the metals is formed by an electroplating method, but the method is not limited to any particular one.

A specific material used for the low-dielectric layer includes carbon doped oxide (SiOC)-based, methylsilsesquioxane (MSQ)-based, and hydroxysilsesquioxane (HSQ)-based materials. A low-dielectric layer having a permittivity k of 3.2 or less is preferable because such a layer can avoid influence from being exerted on the electric characteristics of the wiring layer.

The low-dielectric layer may be formed on the conductive layer or on a barrier layer provided on the conductive layer. A burning temperature of the low-dielectric layer is usually 350° C. or higher.

The barrier layer is formed with any of SiC, SiN, SiCN, Ta, and TaN. The barrier layer may be formed in between the dielectric layers.

A resist material used in the lithography method includes a material used for (KrF, ArF, and $F_2$) excimer laser or an electron beam, and this material can be used in a conventional method.

A buried material is temporarily buried into the formed via hole and/or the trench. Specifically, a spin on glass material obtained by a condensation reaction is preferable to be used as the buried material.

The spin on glass material preferably used in the method of forming wiring according to the present invention is obtained by hydrolyzing at least one compound selected from among compounds represented by the following formulae (i), (ii), and (iii) by the action of acid under the presence of water.

$$Si(OR^1)_a(OR^2)_b(OR^3)_c(OR^4)_d \qquad (i)$$

where $R^1$, $R^2$, $R^3$, and $R^4$ are each independently an alkyl group or a phenyl group having 1 to 4 carbon atoms; a, b, c, and d are each an integer of from 0 to 4, with the proviso that the sum of a, b, c, and d is 4.

$$R^5Si(OR^6)_e(OR^7)_f(OR^8)_g \qquad (ii)$$

where $R^5$ is a hydrogen atom or an alkyl group having 1 to 4 carbon atoms; $R^6$, $R^7$, and $R^8$ are each independently an alkyl group or a phenyl group having 1 to 3 carbon atoms; e, f, and g are each an integer of from 0 to 3, with the proviso that the sum of e, f, and g is 3.

$$R^9R^{10}Si(OR^{11})_h(OR^{12})_i \qquad (iii)$$

where $R^9$ and $R^{10}$ are each independently a hydrogen atom or an alkyl group having 1 to 4 carbon atoms; $R^{11}$ and $R^{12}$ are each independently an alkyl group or a phenyl group having 1 to 3 carbon atoms; h and i are each an integer of from 0 to 2, with the proviso that the sum of h and i is 2.

Examples of the compound represented by the formula (i) include tetraalkoxysilanes and oligomers thereof, such as tetramethoxysilane, tetraethoxysilane, tetrapropoxysilane, tetrabutoxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxy monobutoxysilane, diethoxymonomethoxy monobutoxysilane, diethoxymonopropoxy monobutoxysilane, dipropoxymonomethoxy monoethoxysilane, dipropoxymonomethoxy monobutoxysilane, dipropoxymonoethoxy monobutoxysilane, dibutoxymonomethoxy monoethoxysilane, dibutoxymonoethoxy monopropoxysilane, and monomethoxymonoethoxy propoxymonobutoxysilane. Among these compounds, tetramethoxysilane, tetraethoxysilane, or oligomers thereof are preferable.

Examples of the compound represented by the formula (ii) include trimethoxysilane, triethoxysilane, tripropoxysilane, triphenyloxysilane, dimethoxymonoethoxysilane, diethoxymonomethoxysilane, dipropoxymonomethoxysilane, dipropoxymonoethoxysilane, diphenyloxymonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monophenyloxydiethoxysilane, methyl trimethoxysilane, methyl triethoxysilane, methyl tripropoxysilane, ethyl trimethoxysilane, ethyl tripropoxysilane, ethyl triphenyloxysilane, propyl trimethoxysilane, propyl triethoxysilane, propyl triphenyloxysilane, butyl trimethoxysilane, butyl triethoxysilane, butyl tripropoxysilane, butyl triphenyloxysilane, methyl monomethoxydiethoxysilane, ethyl monomethoxydiethoxysilane, propyl monomethoxydiethoxysilane, butyl monomethoxydiethoxysilane, methyl monomethoxydipropoxysilane, methyl monomethoxydiphenyloxysilane, ethyl monomethoxydipropoxysilane, ethyl monomethoxydiphenyloxysilane, propyl monomethoxydipropoxysilane, propyl monomethoxydiphenyloxysilane, butyl monomethoxydipropoxysilane, butyl monomethoxydiphenyloxysilane, methyl methoxyethoxypropoxysilane, propyl methoxyethoxypropoxysilane, butyl methoxyethoxypropoxysilane, methyl monomethoxymonoethoxy monobutoxysilane, ethyl monomethoxymonoethoxy monobutoxysilane, propyl monomethoxymonoethoxy monobutoxysilane, and butyl monomethoxymonoethoxy monobutoxysilane. Among these compounds, trimethoxysilane and triethoxysilane are preferable.

Furthermore, examples of the compound represented by the formula (iii) include dimethoxysilane, diethoxysilane, dipropoxysilane, diphenyloxysilane, methoxyethoxysilane, methoxypropoxysilane, methoxyphenyloxysilane, ethoxypropoxysilane, ethoxyphenyloxysilane, methyl dimethoxysilane, methyl methoxyethoxysilane, methyl diethoxysilane, methyl methoxypropoxysilane, methyl methoxyphenyloxysilane, ethyl dipropoxysilane, ethyl methoxypropoxysilane, ethyl diphenyloxysilane, propyl dimethoxysilane, propyl methoxyethoxysilane, propyl ethoxypropoxysilane, propyl diethoxysilane, propyl diphenyloxysilane, butyl dimethoxysilane, butyl methoxyethoxysilane, butyl diethoxysilane, butyl ethoxypropoxysilane, butyl dipropoxysilane, butyl methylphenyloxysilane, dimethyl dimethoxysilane, dimethyl methoxyethoxysilane, dimethyl diethoxysilane, dimethyl diphenyloxysilane, dimethyl ethoxypropoxysilane, dimethyl dipropoxysilane, diethyl dimethoxysilane, diethyl methoxypropoxysilane, diethyl diethoxypropoxysilane, dipropyl dimethoxysilane, dipropyl diethoxysilane, dipropyl diphenyloxysilane, dibutyl dimethoxysilane, dibutyl diethoxysilane, dibutyl dipropoxysilane, dibutyl methoxyphenyloxysilane, methyl ethyl dimethoxysilane, methyl ethyl diethoxysilane, methyl ethyl dipropoxysilane, methyl ethyl diphenyloxysilane, methyl propyl dimethoxysilane, methyl propyl diethoxysilane, methyl butyl dimethoxysilane, methyl butyl diethoxysilane, methyl butyl dipropoxysilane, methyl ethyl ethoxypropoxysilane, ethyl propyl dimethoxysilane, ethyl propyl methoxyethoxysilane, dipropyl dimethoxysilane, dipropyl methoxyethoxysilane, propyl butyl dimethoxysilane, propyl butyl diethoxysilane, dibutyl methoxypropoxysilane, and butyl ethoxypropoxysilane. Among these compounds, dimethoxysilane, diethoxysilane, and methyldimethoxysilane are preferable.

The compounds of the formulae (i) to (iii) may be selectively used as required.

Furthermore, any highly absorbing substance may be compounded if necessary. The absorbing substance has a substituted group that can be condensed with the spin on glass material in its structure. Therefore, the substance is not limited to any particular one if the substance has a high absorbing power of light in a wavelength region having photosensitive characteristics of a photosensitive component in a photoresist material, and can prevent standing wave produced by light reflected from the substrate and irregular reflection caused by difference in level on the surface of the substrate. Specific examples of the substance include a sulfone-based compound, a benzophenone-based compound, an anthracene-based compound, and a naphtalene-based compound substituted by a hydroxy group and/or a carboxyl group. Particularly preferred ones are a bisphenylsulfone-based compound and a benzophenone-based compound having at least two hydroxyl groups, an anthracene-based compound having at least one hydroxyl group and/or hydroxyalkyl group, an anthracene-based compound having carboxyl group and/or hydroxyl group, and a naphthalene-based compound substituted by at least one carboxyl group and/or hydroxyl group.

Examples of the bisphenylsulfone-based compound include bis(hydroxyphenyl)sulfones, and bis(polyhydroxyphenyl)sulfones. Specific examples of these compounds include bis(4-hydroxyphenyl)sulfone, bis(3,5-dimethyl-4-hydroxyphenyl)sulfone, bis(2,3-dihydroxyphenyl)sulfone, bis(2,4-dihydroxyphenyl)sulfone, bis(2,4-dihydroxy-6-methyl phenyl)sulfone, bis(5-chloro-2,4-dihydroxyphenyl)sulfone, bis(2,5-dihydroxyphenyl)sulfone, bis(3,4-dihydroxyphenyl)sulfone, bis(3,5-dihydroxyphenyl)sulfone, bis(2,3,4-trihydroxyphenyl)sulfone, bis(2,3,4-trihydroxy-6-methyl phenyl)sulfone, bis(5-chloro-2,3,4-trihydroxyphenyl)sulfone, bis(2,4,6-trihydroxyphenyl)sulfone, and bis(5-chloro-2,3-dihydroxyphenyl)sulfone. Specific examples of the benzophenone-based compound include 2,4-dihydroxybenzophenone, 2,3,4-trihydroxybenzophenone, 2,2',4,4'-tetrahydroxybenzophenone, 2,2',5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2',4'-dihydroxybenzophenone, and 4-dimethylamino-3',4'-dihydroxybenzophenone.

Furthermore, the anthracene-based compound having at least one hydroxyl group or hydroxyalkyl group includes a compound represented by the formula (4) explained below. Specific examples of the compound include 1-hydroxyanthracene, 9-hydroxyanthracene, anthracene-9-carboxylic acid, 1,2-dihydroxyanthracene, 1,2-dihydroxy-9-carboxyanthracene, 1,5-dihydroxyanthracene, 1,5-dihydroxy-9-carboxyanthracene, 9,10-dihydroxyanthracene, 1,2-dihydroxy-9-carboxyanthracene, 1,2,3-trihydroxyanthracene, 1,2,3,4-tetrahydroxyanthracene, 1,2,3,4,5,6-hexahydroxyanthracene, 1,2,3,4,5,6,7,8-octahydroxyanthracene, 1-hydroxymethylanthracene, 9-hydroxymethylanthracene, 9-hydroxyethylanthracene, 9-hydroxyhexylanthracene, 9-hydroxyoctylanthracene, and 9,10-dihydroxymethylanthracene.

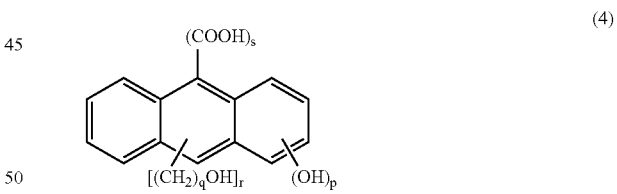

(4)

Where p represents an integer of from 0 to 8, q represents an integer of from 1 to 10, r represents an integer of from 0 to 6, s represents an integer of 0 or 1, with the proviso that p, q, and r are not 0 at the same time.

Specific examples of the naphthalene-based compound include 1-naphthol, 2-naphthol, 1-naphthalene ethanol, 2-naphthalene ethanol, 1,3-naphthalene diol, naphthalene-1-carboxylic acid, naphthalene-2-carboxylic acid, naphthalene-1,4-dicarboxylic acid, naphthalene-2,3-dicarboxylic acid, naphthalene-2,6-dicarboxylic acid, naphthalene-2,7-dicarboxylic acid, and naphthalene-1-acetic acid.

The amount of the highly absorbing substance to be compounded is in a range of 10 to 50 weight percent, more preferably 15 to 40 weight percent, in the concentration of solid portion of the spin on glass material on an $SiO_2$ basis.

The "predetermined point in time", according to the present invention, at which the cleaning composition should be used is not particularly restricted if it is a time required to remove the photoresist film and metallic residues from the substrate in the process of forming wiring using the damascene process. However, the time is preferably set to a time after the etched space is formed. The time is specified as "after formation of the trench", "after formation of the via", and "after removal of the barrier layer".

The "after formation of the trench" is more clearly specified as a stage in which generally, a forming process of an inter-layer dielectric layer comprised of at least a low-dielectric layer on a lower wiring layer formed on a semiconductor substrate is performed, then a photoresist layer is formed on the inter-layer dielectric layer, the photoresist layer is subjected to pattern exposure and is developed to form a photoresist pattern, etching is performed on the substrate using the photoresist pattern as a mask, and then the photoresist layer is removed.

The "after formation of the via" is more clearly specified as a stage in which a low-dielectric layer, a barrier layer, and a reflection preventing film are sequentially layered on the lower wiring layer, a photoresist layer is formed on the reflection preventing film, the photoresist layer is subjected to pattern exposure and is developed to form a photoresist pattern, etching is performed on the layers using the photoresist pattern as a mask, a via hole communicating with the lower wiring layer is formed, and then the photoresist layer is removed.

As well known, in the dual damascene process in which the trench and the via hole are sequentially formed, there are two cases, that is, a case where the via hole is formed after formation of the trench and a case where the trench is formed after formation of the via hole. It does not matter which of the trench and the via hole is first formed.

Generally, after a via hole and/or trench pattern is etched, the resist film is subjected to ashing treatment. From the viewpoint of maintaining the characteristics of the low-k material, it is desirable not to depend on the ashing treatment because the ashing process damages the low-k material, and therefore this matter is being under study. However, using the cleaning composition according to the present invention allows the ashing process to be omitted.

Either of the trench and the via hole is formed, the inside of the formed one is filled with a material to be buried, and the other one of the trench or the via hole is formed using the ordinary lithography method. After the formation, the silicon oxide film (buried material) remaining inside either the trench on the lower side or the via hole and remaining in the lower layer of the resist pattern was cleaned off using the cleaning composition for the lithography of the present invention.

The removal through cleaning is performed for 1 to 40 minutes at 20 to 85° C. using the ordinary dip method, paddle method, and showering method, but the method is not limited to these methods.

EXAMPLES

Preparation of Cleaning Composition:

A cleaning composition was prepared based on the composition and compounded amounts shown in Table 1. An anticorrosive was obtained by compounding thioglycerol with IRGAMET 42 (product name manufactured by Ciba Speciality Chemicals) as a benzotriazole-based anticorrosive by a ratio of 3:2. The obtained anticorrosive was added to whole experimental examples and comparative examples in an amount of 2.5 mass percent of the total amounts of the solution.

Commercially available samples were used for the samples unless otherwise specified. It is noted that TEAH represents tetraethylammonium hydroxide, TPAH represents tetrapropylammonium hydroxide, MTBAH represents methyltributylammonium hydroxide, TBAH represents tetrabutylammonium hydroxide, and TMAH represents tetramethylammonium hydroxide. Furthermore, MEA represents monoethanolamine, DGA represents 2-(2-aminoethoxy)ethanol, and MMA represents N-methylethanolamine. Moreover, DMSO represents dimethyl sulfoxide, NMP represents N-methyl-2-pyrrolidone, and DMI represents dimethyl imidazolidinone.

TABLE 1

| | Quaternary ammonium hydroxide (mass percent) | Alkanol-amine (mass percent) | Water (mass percent) | Potassium hydroxide (mass percent) | Water-soluble organic solvent (remainder) |
|---|---|---|---|---|---|
| Example 1 | TEAH 2 | MEA 20 | 20 | 0.05 | DMSO |
| Example 2 | TEAH 5 | DGA 30 | 30 | 0.02 | NMP |
| Example 3 | TPAH 10 | DGA 15 | 60 | 0.01 | DMI |
| Example 4 | MTBAH 5 | MEA 20 | 40 | 0.1 | DMSO |
| Example 5 | TBAH 15 | MMA 45 | 30 | 0.05 | DMSO |
| Example 6 | TMAH 10 | MMA 15 | 30 | 0.03 | NMP |
| Example 7 | TEAH 2 | — | 30 | 0.03 | DMSO |
| Example 8 | TMAH 10 | — | 40 | 0.02 | NMP |
| Comparative Example 1 | TEAH 8 | DGA 20 | 30 | 2 | NMP |
| Comparative Example 2 | TBAH 10 | MEA 40 | — | 0.05 | DMI |
| Comparative Example 3 | TMAH 5 | MMA 30 | 50 | — | DMSO |
| Comparative Example 4 | — | DGA 30 | 30 | 0.1 | NMP |

Examples 1 to 8

A barrier layer as a first layer and a low-dielectric layer as a second layer (dielectric layer was CVD deposited with dielectric value in the range of 2.9-3.2.) were formed on a substrate where a Cu layer was formed. A photoresist pattern was formed by the lithography method on the second layer, and the substrate was etched using the photoresist pattern as a mask through the low-dielectric layer to make a via hole that communicates with the barrier layer.

Subsequently, a spin on glass material to be buried (manufactured by Honeywell) was buried inside the via hole, a photoresist pattern was newly formed by the lithography method, and etching was performed on the substrate using the pattern as a mask to form a trench. During this process, an etched resist was formed on the surface of the resist layer due to etching damage by etching gas and was hard to be removed by the cleaning composition, Si-based metallic residue produced when the low-k material was removed through etching was deposited in the sidewall of the trench pattern, and the buried material remained inside the via hole.

This substrate was dipped in the cleaning composition shown in Table 1 for 5 minutes at 60° C., and was rinsed with DI water. At this time, evaluations were performed on the strippability of the etched resist, the strippability of the Si-based metallic residues, and the strippability of the buried material, and further on how the solution was corrosive to the low-k material, through observation using a scanning electron microscope (SEM). The results of the observation are shown in Table 2.

Furthermore, the substrate was etched to remove the barrier layer from the substrate. Then, in the same manner as explained above, the substrate was dipped in the cleaning composition shown in Table 1 for 5 minutes at 60° C., and was rinsed with ultra pure water. At this time, evaluations were performed on how the solution was corrosive to Cu through observation using the SEM. The results of the observation are shown in Table 2.

The results of the observations are obtained as shown in Table 2. In the table, reference sign S indicates that a target to be stripped was fully removed or the substrate and Cu were not corroded at all. In the table, reference sign A is used for representing the same evaluation as S, but indicates that slight surface roughness was seen although there was no possibility of bringing about an actual device failure. Furthermore, reference sign B indicates that the photoresist remained on the substrate or the substrate and Cu were corroded.

TABLE 2

| | Strippability of etched resist | Strippability of Si-based metallic residue | Strippability of buried material | Protection effect of low-k material against corrosion | Protection effect of Cu against corrosion |
| --- | --- | --- | --- | --- | --- |
| Example 1 | S | S | S | S | S |
| Example 2 | S | S | S | S | S |
| Example 3 | S | A | S | S | S |
| Example 4 | S | S | S | A | S |
| Example 5 | S | S | S | S | S |
| Example 6 | S | S | S | S | S |
| Example 7 | A | A | A | S | S |
| Example 8 | S | S | S | S | S |
| Comparative Example 1 | S | S | S | B | A |
| Comparative Example 2 | B | B | S | S | S |
| Comparative Example 3 | S | A | B | S | S |
| Comparative Example 4 | B | A | B | S | S |

In examples 1, 2, 5, 6, and 8, sufficient results were obtained for all the items. In Examples 3, 4, and 7, the results were slightly inferior to the other examples, but no particular problem to be posed was recognized:

Comparative Examples 1 to 4

In the same manner as the examples, the results of the strippability of the etched resist, the strippability of the Si-based metallic residue, the strippability of the buried material, the protection effect of the low-k material against corrosion, and the protection effect of Cu against corrosion were obtained.

In comparative example 1, the amount of KOH exceeded the upper limit, and therefore the low-k material was corroded. On the other hand, no KOH was contained in comparative example 3, and therefore the strippability of the buried material was found insufficient, and the strippability of the Si-based metallic residue was slightly below a sufficient level.

In comparative example 2, a small amount of water was contained, and therefore the strippability of the etched resist and the strippability of the Si-based metallic residue were found insufficient.

In comparative example 4, no quaternary ammonium hydroxide was contained, and therefore the strippability of the etched resist and the strippability of the buried material were found insufficient. Further, the strippability of the Si-based metallic residue was slightly below the sufficient level.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A cleaning composition for cleaning a semiconductor substrate comprising a low-dielectric layer, a photoresist film, a buried material and a residue of metal, said cleaning composition comprising:

quaternary ammonium hydroxide; a water-soluble organic solvent of from 2 to 85 mass percent of the total amount of the cleaning composition;

water;

an anticorrosive; and potassium hydroxide of from 0.001 to 0.1 mass percent of a total amount of the cleaning composition, wherein the water-soluble organic solvent comprises an alkanolamine-based water-soluble organic solvent and any other water-soluble organic solvent, the amount of the alkanolamine-based water-soluble organic solvent is in the range of from 15 to 50 mass percent of the total amount of the cleaning composition and the remaining water-soluble organic solvent is the any other water-soluble organic solvent, and said cleaning composition removes at least one of photoresist film, buried material and residue of metal from said semiconductor substrate, without degrading the low-dielectric layer.

2. The cleaning composition according to claim 1, wherein the quaternary ammonium hydroxide is a compound represented by the following general formula (1):

$$[NR_1R_2R_3R_4]^+OH^- \qquad (1)$$

where $R_1$, $R_2$, $R_3$, and $R_4$ are each either of an alkyl group and a hydroxyalkyl group having 1 to 4 carbon atoms.

3. The cleaning composition according to claim 1, wherein the quaternary ammonium hydroxide is selected from the group consisting of tetramethylammonium hydroxide, tetraethylammonium hydroxide, tetrapropylammonium hydroxide, tetrabutylammonium hydroxide, methyltripropylammonium hydroxide, and methyltributylammonium hydroxide.

4. The cleaning composition of claim 1, wherein the low-dielectric layer has a permittivity k which is 3.2 or less.

5. A method of cleaning a semiconductor substrate comprising: applying a cleaning composition according to claim 1 to the substrate that is being processed to form a metal wiring using a temporary laminated film obtained by temporarily layering film on the substrate; and removing at least one of a photoresist film and a buried material as the laminated film on the substrate, and a metallic residue after formation of the metal wiring.

6. The method according to claim 5, wherein the substrate includes at least a low-dielectric layer of which permittivity k is 3.2 or less.

* * * * *